United States Patent
Haraguchi et al.

(10) Patent No.: US 9,930,782 B2
(45) Date of Patent: Mar. 27, 2018

(54) SWITCHING BOARD

(71) Applicants: Sumitomo Wiring Systems, Ltd, Yokkaichi, Mie (JP); AutoNetworks Technologies, Ltd., Yokkaichi, Mie (JP); Sumitomo Electric Industries, Ltd., Chuo-ku, Osaka-Shi, Osaka (JP)

(72) Inventors: Akira Haraguchi, Mie (JP); Manabu Hashikura, Mie (JP); Hideo Morikoka, Mie (JP); Hideaki Tahara, Mie (JP)

(73) Assignees: Sumitomo Wiring Systems, Ltd., Yokkaichi, Mie (JP); AutoNetworks Technologies, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/113,576

(22) PCT Filed: Jan. 9, 2015

(86) PCT No.: PCT/JP2015/050482
§ 371 (c)(1),
(2) Date: Jul. 22, 2016

(87) PCT Pub. No.: WO2015/111450
PCT Pub. Date: Jul. 30, 2015

(65) Prior Publication Data
US 2017/0006703 A1  Jan. 5, 2017

(30) Foreign Application Priority Data
Jan. 22, 2014  (JP) ................................ 2014-009720

(51) Int. Cl.
*H05K 1/18* (2006.01)
*H03K 17/06* (2006.01)
(Continued)

(52) U.S. Cl.
CPC ............. *H05K 1/18* (2013.01); *H03K 17/063* (2013.01); *H05K 1/0203* (2013.01);
(Continued)

(58) Field of Classification Search
CPC ....... H03K 17/063; H05K 1/0203; H05K 1/18
(Continued)

(56) References Cited

U.S. PATENT DOCUMENTS

| 6,078,501 | A | * | 6/2000 | Catrambone | ......... | H02M 7/003 |
|---|---|---|---|---|---|---|
| | | | | | | 174/50 |
| 2003/0137813 | A1 | * | 7/2003 | Onizuka | ............. | H05K 1/0263 |
| | | | | | | 361/777 |
| 2017/0054276 | A1 | * | 2/2017 | Zhang | ..................... | H02B 1/30 |

FOREIGN PATENT DOCUMENTS

| EP | 0945959 A2 | 9/1999 |
|---|---|---|
| EP | 09545959 A2 | 9/1999 |

(Continued)

OTHER PUBLICATIONS

European Search Report for PCT/JP2015050482 dated Dec. 8, 2016.

*Primary Examiner* — Dion R Ferguson
*Assistant Examiner* — Mandeep S Buttar
(74) *Attorney, Agent, or Firm* — Dinsmore & Shohl LLP

(57) ABSTRACT

A switching board is provided with a control circuit board including a control circuit, first mounting windows and second mounting windows, a circuit constituent including an input busbar, an output busbar and a connection busbar arranged on one surface of the control circuit board, and first and second semiconductor switching elements. The first semiconductor switching elements are arranged inside the first mounting windows and have drain terminals connected to the input busbar, source terminals connected to the connection busbar and gate terminals connected to the control circuit. The second semiconductor switching ele- (Continued)

ments are arranged inside the second mounting windows and have drain terminals connected to the output busbar, source terminals connected to the connection busbar and gate terminals connected to the control circuit.

5 Claims, 13 Drawing Sheets

(51) Int. Cl.
*H05K 1/02* (2006.01)
*H03K 17/687* (2006.01)

(52) U.S. Cl.
CPC ... *H03K 17/6871* (2013.01); *H03K 2017/066* (2013.01); *H05K 2201/10166* (2013.01)

(58) Field of Classification Search
USPC ....... 361/719, 820, 837, 828; 174/17.05, 50; 429/97
See application file for complete search history.

(56) References Cited

FOREIGN PATENT DOCUMENTS

| | | |
|---|---|---|
| JP | 11324873 A | 11/1999 |
| JP | 2009-164039 A | 6/2003 |
| JP | 2004063681 A | 2/2004 |
| JP | 2006060949 A | 3/2006 |
| JP | 2009146933 A | 7/2009 |
| JP | 2010178428 A | 8/2010 |

* cited by examiner

SWITCHING BOARD

CROSS-REFERENCE TO RELATED APPLICATIONS

This application is the U.S. national stage of PCT/JP2015/050482 filed Jan. 9, 2015, which claims priority of Japanese Patent Application 2014-009720 filed Jan. 22, 2014.

FIELD OF THE INVENTION

The present invention relates to a switching board.

BACKGROUND OF THE INVENTION

In recent years, automotive vehicles mounted with an auxiliary power supply besides a main battery have been developed for fuel economy improvement and consideration to environments. For example, the amount of power generation by an alternator can be reduced and fuel economy can be improved by accumulating regenerative energy during braking in the auxiliary power supply and using the accumulated energy for the supply of power to electric components during travel. Further, the instantaneous disconnection of the electric components due to an instantaneous voltage drop of the main battery and the deterioration of the main battery can be prevented by supplying power to a starter from the auxiliary power supply when an engine is restarted after an idling stop.

A switching board having a function of switching a power supply mode in correspondence with an operating state of a vehicle such as traveling and an idling stop is disposed between the main battery and the auxiliary power supply in some cases.

Conventionally, boards provided with a mechanical relay compatible with a large current have been used as switching boards. However, it has been proposed to replace mechanical relays with semiconductor switching elements for the purpose of miniaturization, longer service life and noise reduction. It is assumed to use power semiconductors such as MOSFETs (Metal-Oxide-Semiconductor Field-Effect Transistors) as the semiconductor switching elements (see patent literature 1).

Generally, in a switch using a MOSFET, a parasitic diode by a p-n junction is generated between a source and a drain. Accordingly, even if a gate is turned off, a current flows from a source side to a drain side through this parasitic diode, wherefore the flow of the current from the source side to the drain side cannot be completely shut off. Thus, to enable a current to be shut off in both directions, two MOSFETs may be connected in series to reverse an orientation of the parasitic diode.

However, if it is attempted to design such a complicated circuit, the structure of the switching board tends to be complicated.

The present invention was completed based on the above situation and aims to provide a simply configured switching board to be arranged between a main power supply and an auxiliary power supply in a vehicle provided with the main power supply and the auxiliary power supply.

SUMMARY

The present invention is directed towards a switching board to be arranged between a main power supply and an auxiliary power supply, in a vehicle provided with the main power supply and the auxiliary power supply, including a circuit constituent with an insulating plate made of an insulating material, a control circuit arranged on one surface of the insulating plate, a circuit control board including a plurality of mounting windows penetrating from the surface of the insulating plate where the control circuit is provided on an opposite surface, an input busbar and an output busbar arranged on the opposite surface of the insulating plate while being spaced apart from each other and a connection busbar arranged with clearances defined between the connection busbar and the input busbar and the output busbar, and a plurality of semiconductor switching elements mounted on the circuit constituent and each including a drain terminal, a source terminal and a gate terminal, wherein some mounting windows of the plurality of mounting windows are first mounting windows where parts of the input busbar and parts of the connection busbar are exposed inside and the other mounting windows are second mounting windows where parts of the output busbar and parts of the connection busbar are exposed inside, and some semiconductor switching elements of the plurality of semiconductor switching elements are first semiconductor switching elements arranged inside the first mounting windows and having the drain terminals connected to the parts of the input busbar, the source terminals connected to the parts of the connection busbar and the gate terminals connected to the control circuit, and the other semiconductor switching elements are second semiconductor switching elements arranged inside the second mounting windows and having the drain terminals connected to the parts of the output busbar, the source terminals connected to the parts of the connection busbar and the gate terminals connected to the control circuit.

According to the above configuration, the busbars, the control circuit board and the semiconductor switching elements necessary for the switching board to be arranged between the main power supply and the auxiliary power supply can be simply laid out and the simply configured switching board can be provided.

The following modes are preferable as embodiments of the present invention.

The connection busbar may include a connecting portion arranged between the input busbar and the output busbar and a reinforcing portion extending along an arrangement direction of the input busbar and the output busbar.

According to the above configuration, the connection busbar can be provided with a reinforcing function by a simple configuration since the connection busbar includes the connecting portion and the reinforcing portion.

Further, the circuit constituent may include a heat radiation plate arranged on surfaces of the input busbar, the output busbar and the connection busbar opposite to the control circuit board.

According to the above configuration, heat can be efficiently radiated without enlarging the switching board.

According to the present invention, it is possible to provide a simple configured switching board to be arranged between a main power supply and an auxiliary power supply in a vehicle provided with the main power supply and the auxiliary power supply.

DETAILED DESCRIPTION

An embodiment of the present invention is described with reference to FIGS. 1 to 10.

Figure 10:
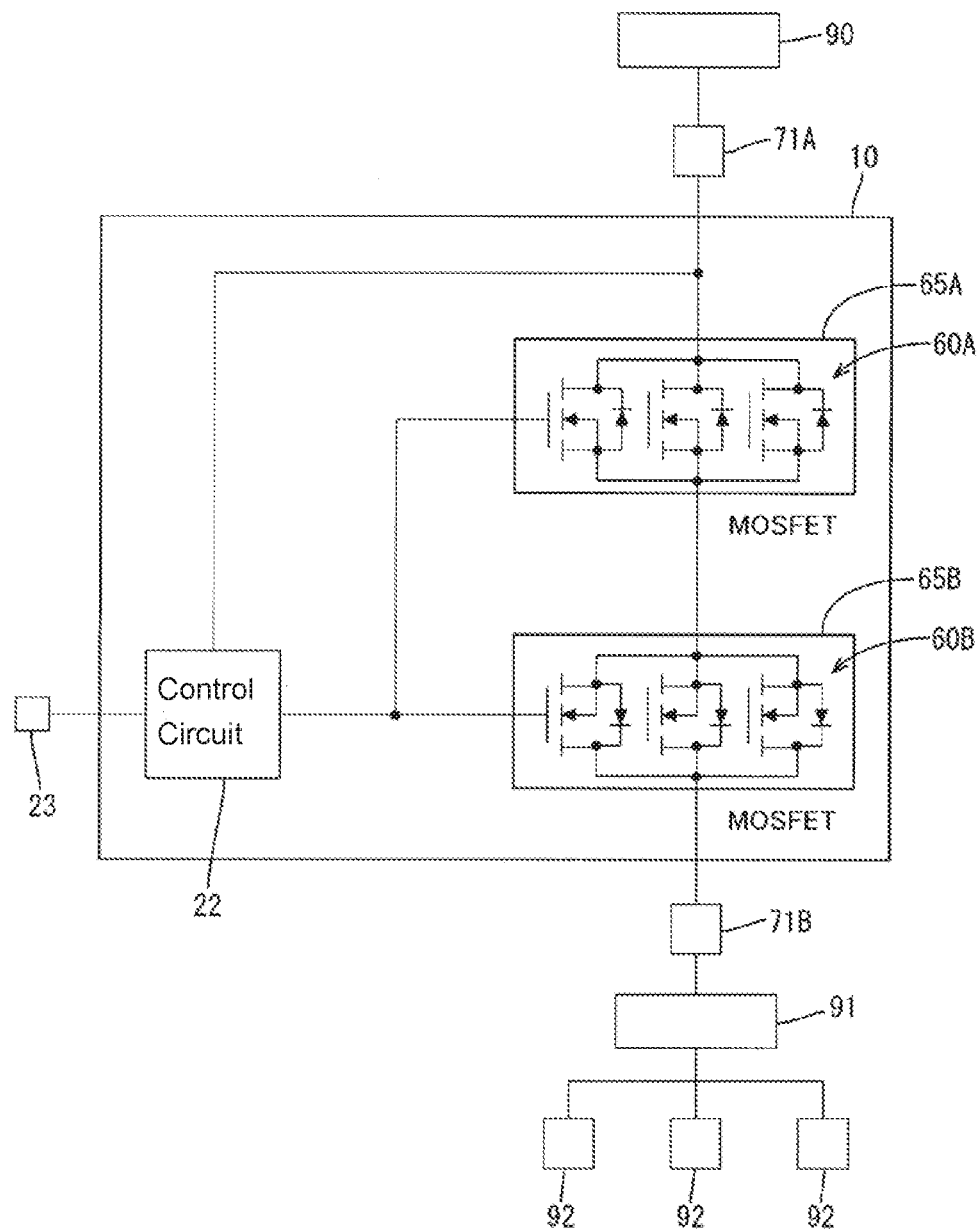
FIG. 10 is a diagram showing a circuit configuration of the switching device of the embodiment.

A switching device 1 of this embodiment switches the supply of power to electric components 92 from a main battery 90 and an auxiliary battery 91 in a vehicle provided with the main battery 90 (corresponding to a main power supply) and the auxiliary battery 91 (corresponding to an auxiliary power supply). As shown in FIG. 10, the main battery 90 and the auxiliary battery 91 are arranged in series and supply power to the electric components 92. The switching device 1 is arranged in series with the main battery 90 and the auxiliary battery 91 between the main battery 90 and the auxiliary battery 91.

Figure 1:
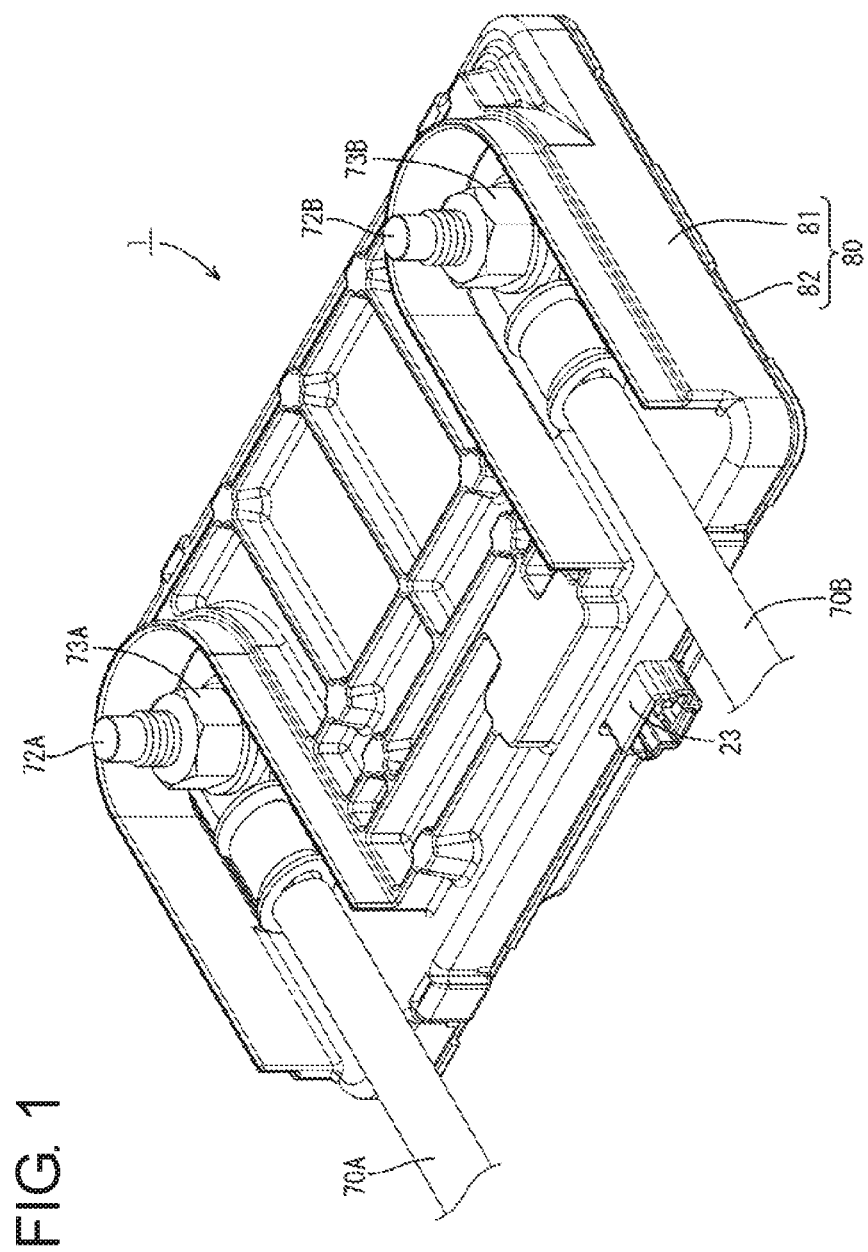
FIG. 1 is a perspective view of a switching device of an embodiment.
Figure 2:
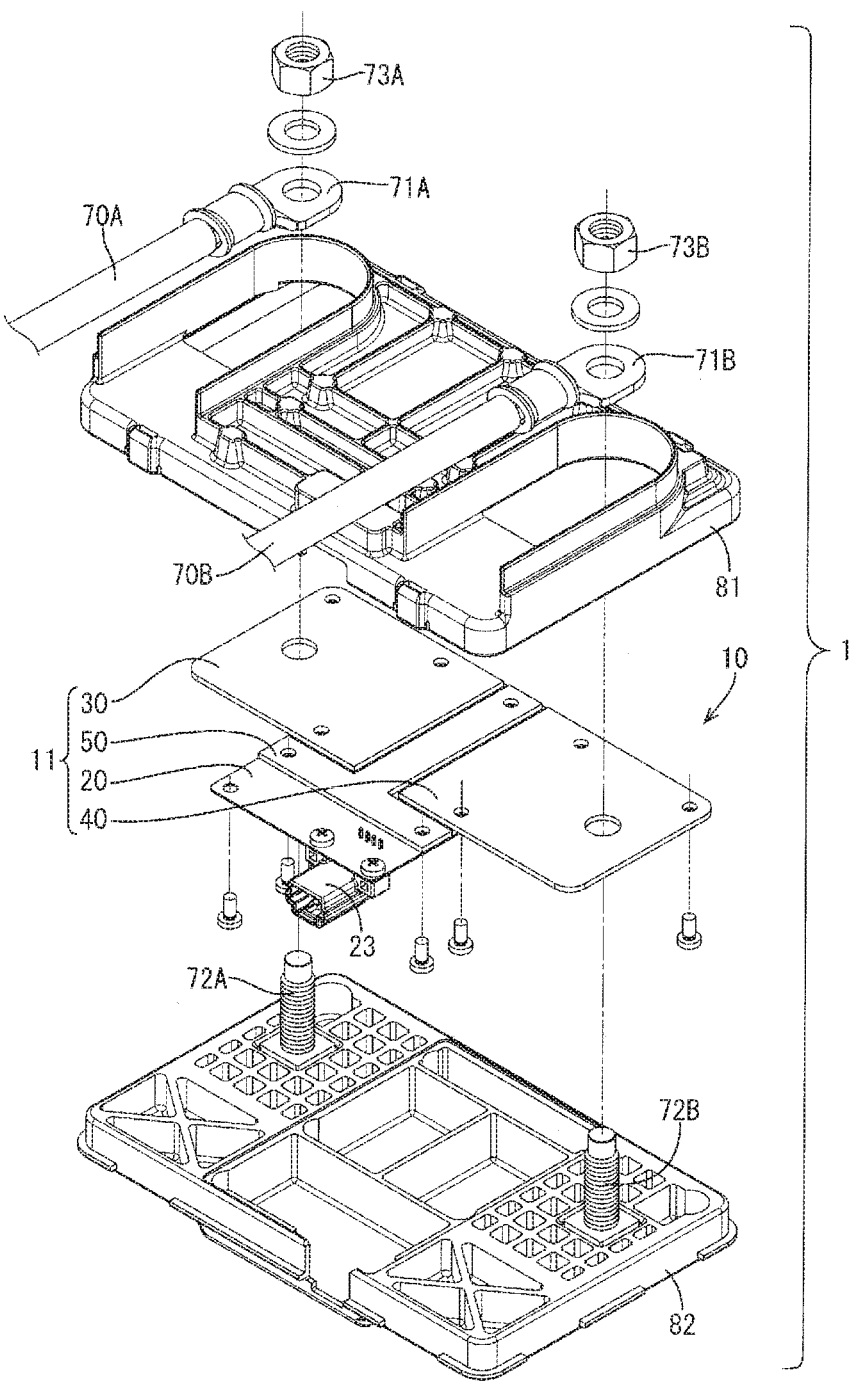
FIG. 2 is an exploded perspective view of the switching device of the embodiment.
Figure 3:
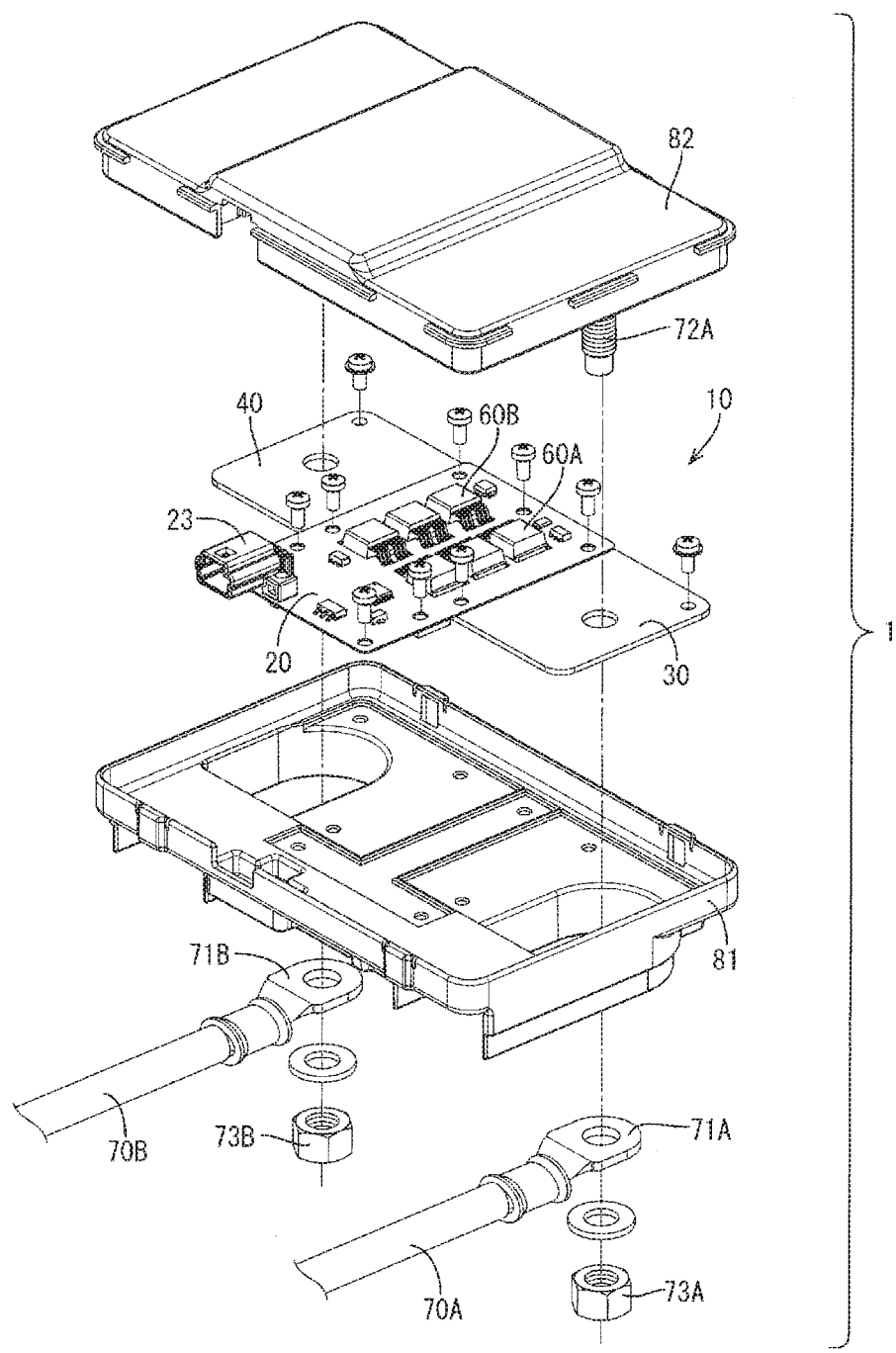
FIG. 3 is an exploded perspective view, vertically inverted from that of FIG. 2, showing the switching device of the embodiment.

As shown in FIGS. 1, 2 and 3, the switching device 1 includes a switching board 10 and a casing 80 for accommodating this switching board 10. The switching board 10 includes a circuit constituent 11 and six semiconductor switching elements 60A, 60B mounted on this circuit constituent 11. The circuit constituent 11 includes a control circuit board 20 and three busbars 30, 40 and 50 placed on this control circuit board 20.

Figure 7:
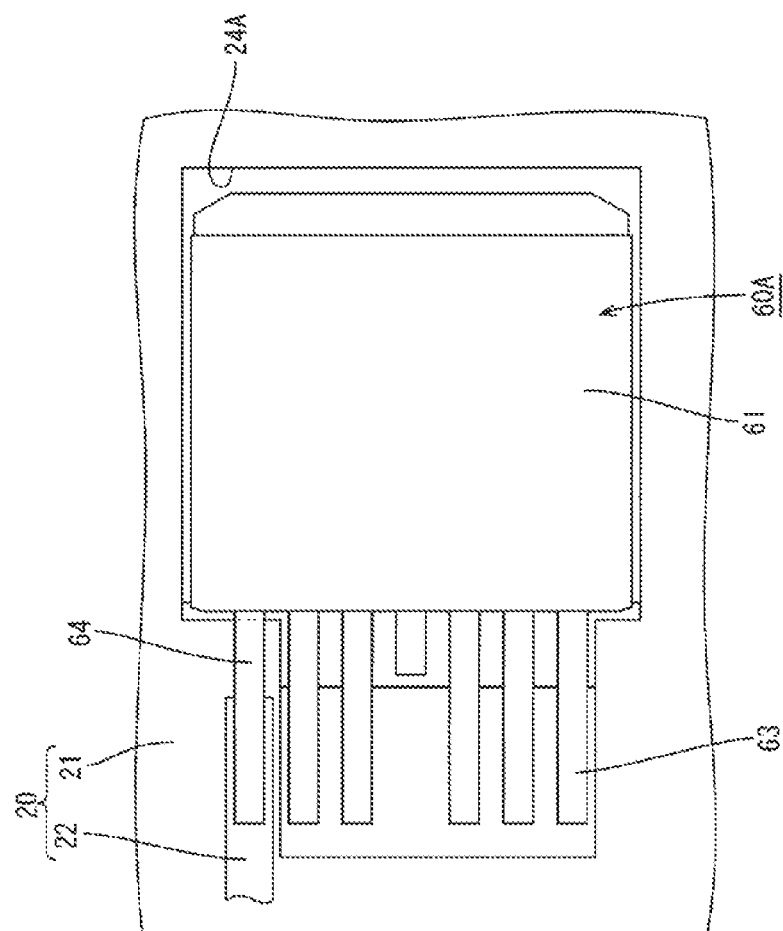
FIG. 7 is an enlarged view of the interior of an area R of FIG. 6.
Figure 8:
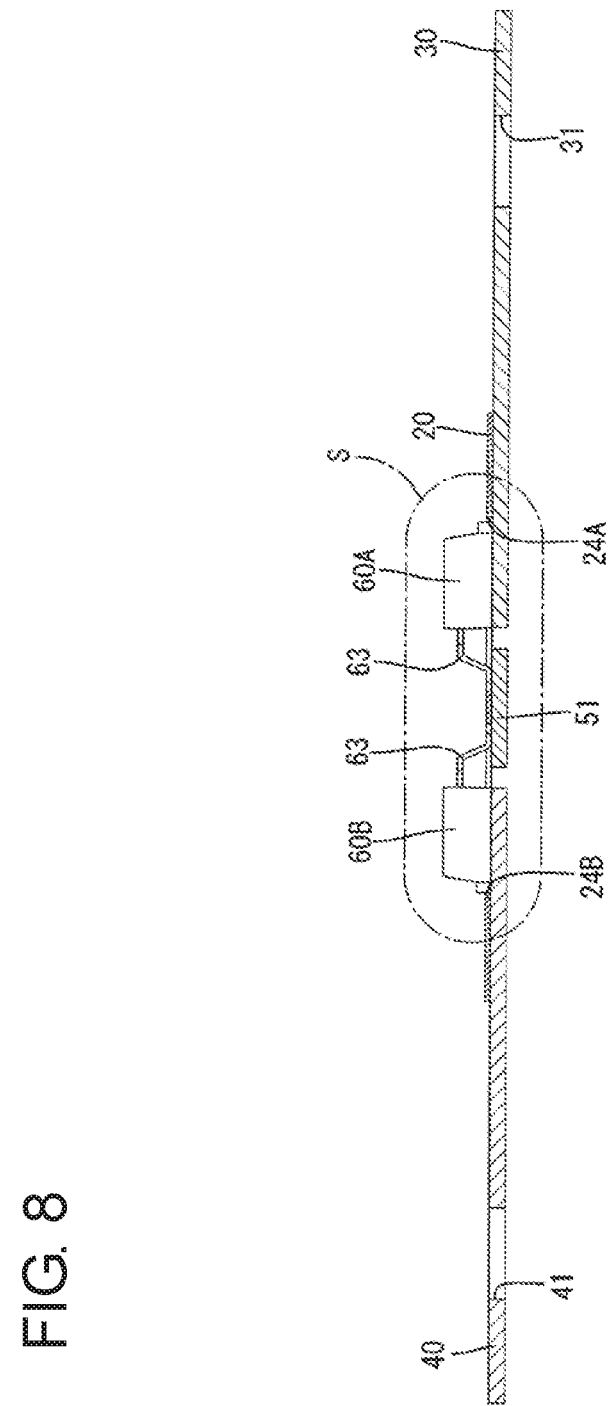
FIG. 8 is a section along A-A of FIG. 6.
Figure 9:
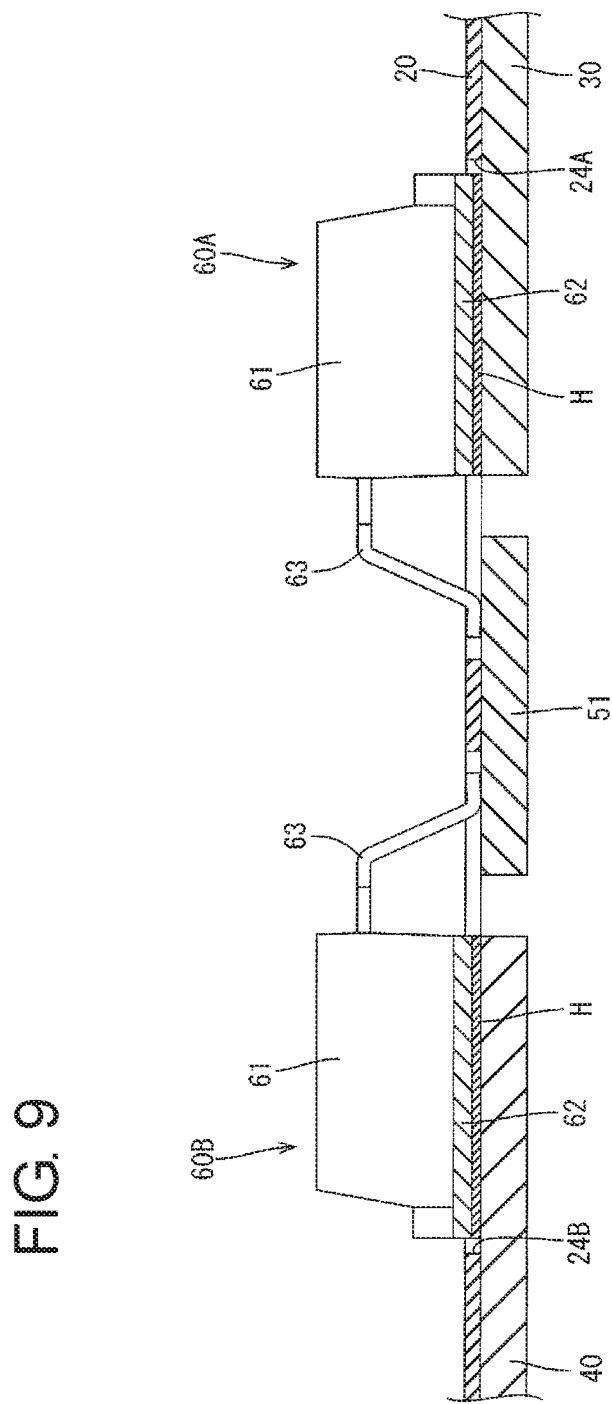
FIG. 9 is an enlarged view of the interior of an area S of FIG. 8.

The control circuit board 20 is a printed board including a control circuit 22 made of an electrically conductive material on one surface side of an insulating plate 21 made of a glass base material or a glass non-woven base material (see FIG. 7). A connector 23 for connecting the control circuit 22 to an external control device (not shown) is arranged on one end part of the control circuit board 20.

Figure 4:
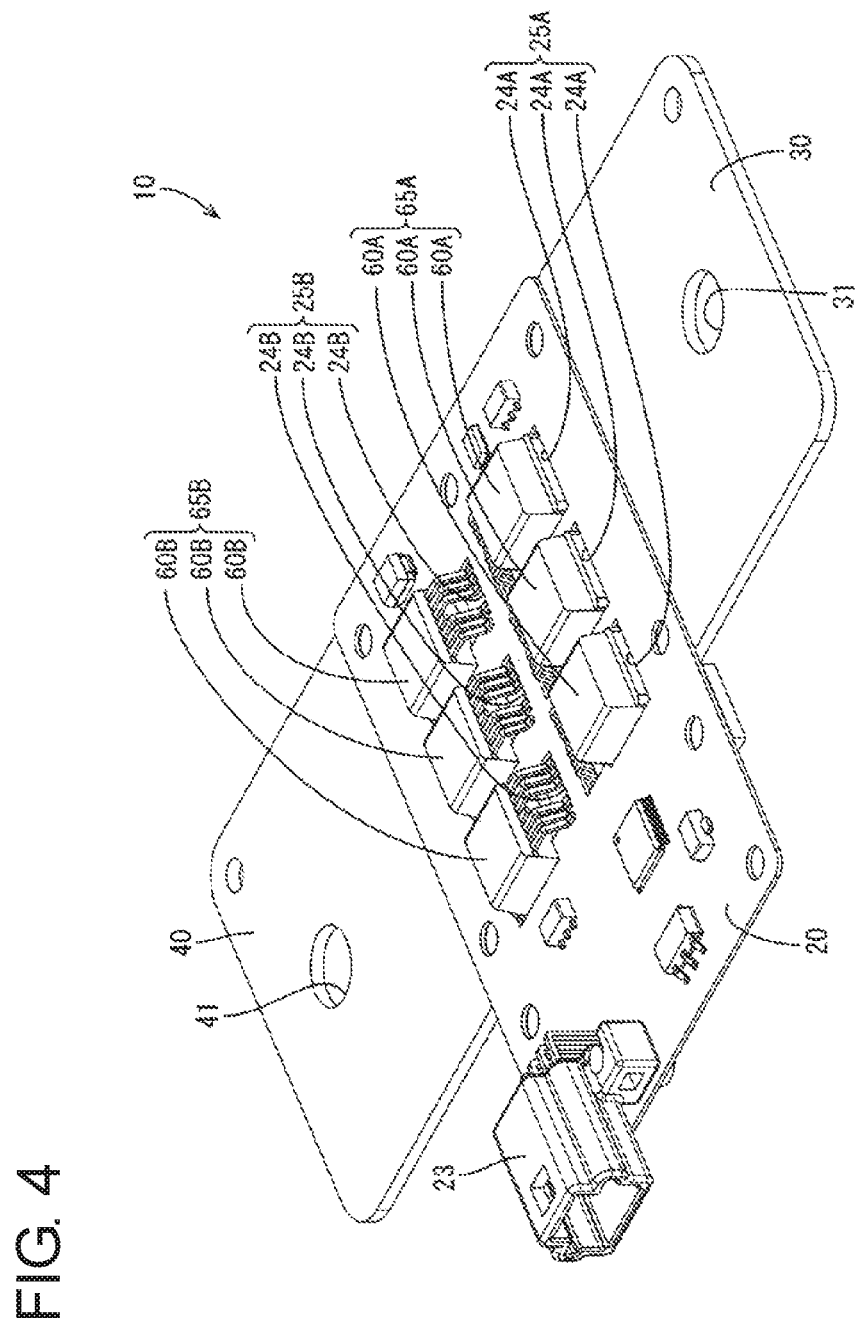
FIG. 4 is a perspective view of the switching device of the embodiment when viewed from a control circuit board side.
Figure 6:
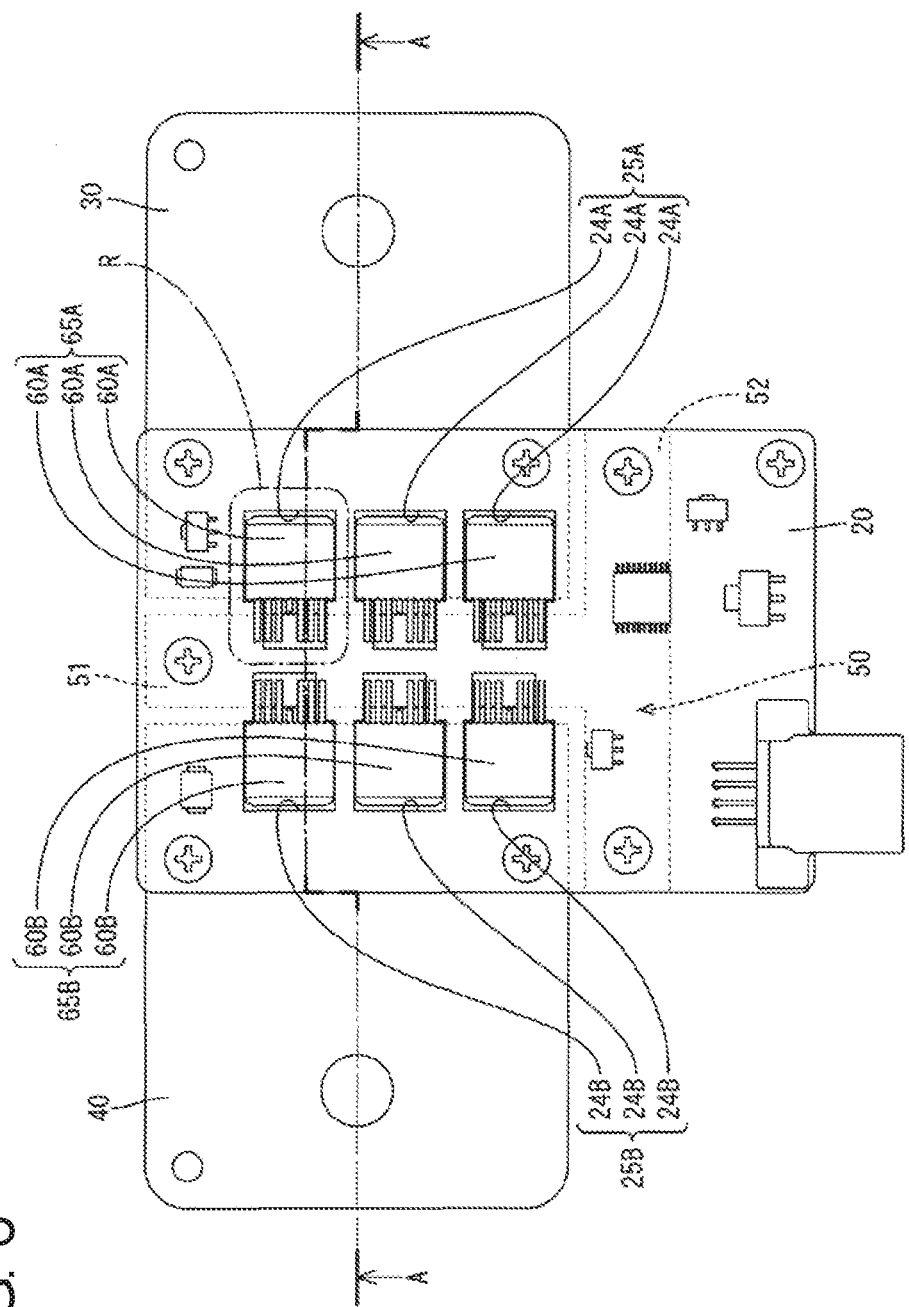
FIG. 6 is a plan view of the switching device of the embodiment.

As shown in FIGS. 4 and 6, the control circuit board 20 includes six mounting windows 24A, 24B for mounting the semiconductor switching elements 60A, 60B. The mounting windows 24A, 24B are rectangular openings penetrating from the surface where the control circuit 22 is arranged to an opposite surface in the control circuit board 20 and those openings are dimensioned to be one size larger than the outer shapes of the semiconductor switching elements 60A, 60B. Three mounting windows (first mounting windows 24A) of the six mounting windows 24A, 24B are arranged in a row to form a first mounting window group 25A. The remaining three mounting windows (second mounting windows 24B) of the six mounting windows 24A, 24B are arranged in a row to form a second mounting window group 25B. Two mounting window groups 25A, 25B are arranged in parallel.

Figure 5:
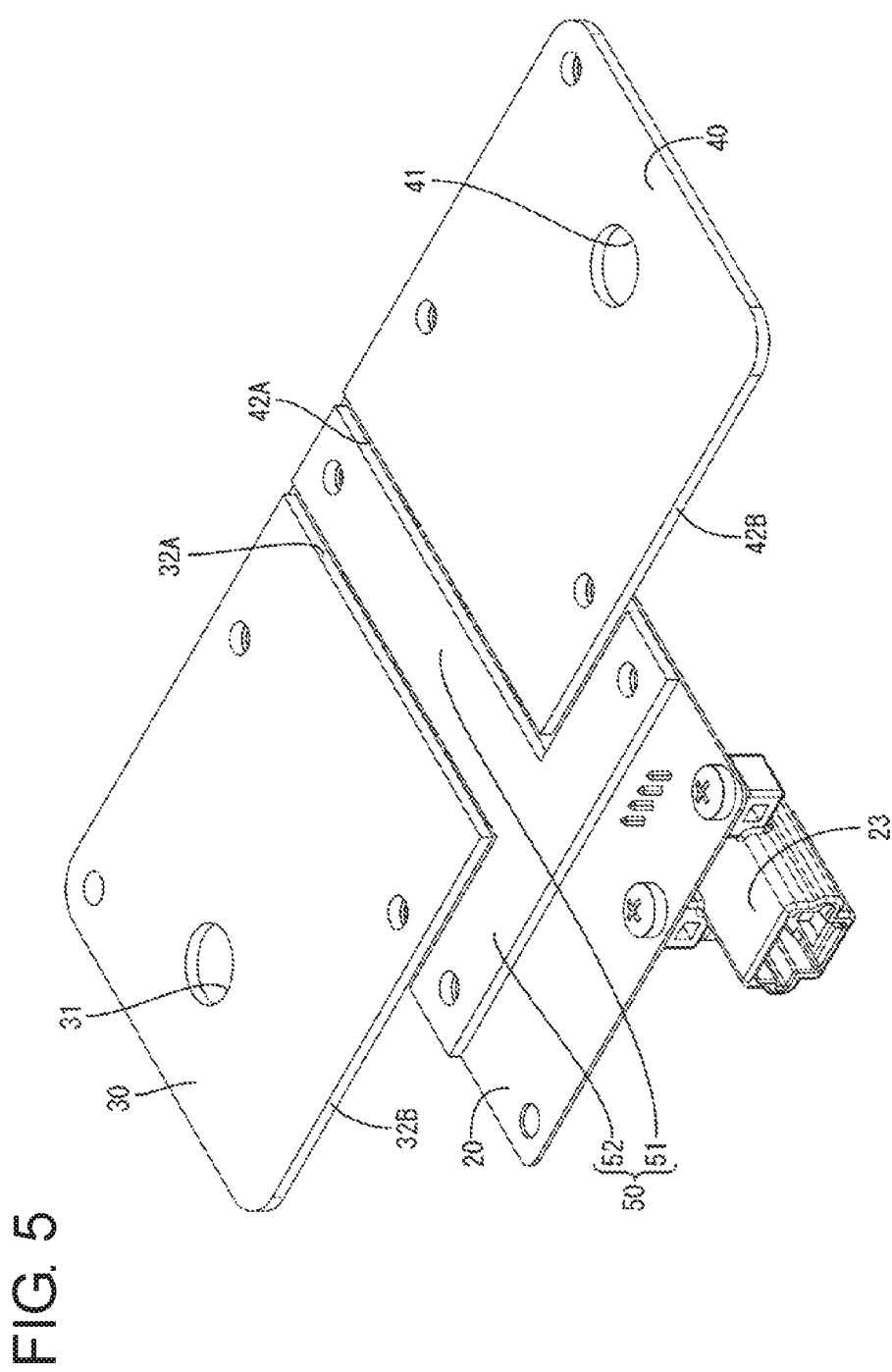
FIG. 5 is a perspective view of the switching device of the embodiment when viewed from a busbar side.

One of the three busbars 30, 40 and 50 is an input busbar 30 and another is an output busbar 40. As shown in FIG. 5, the input busbar 30 is a rectangular thick plate formed of an electrically conductive material (copper or copper alloy in this embodiment). The input busbar 30 is provided with a bolt insertion hole 31. The bolt insertion hole 31 is a through hole penetrating from one plate surface to the other plate surface of the input busbar 30. Similarly to the input busbar 30, the output busbar 40 is also a rectangular thick plate formed of an electrically conductive material (copper or copper alloy in this embodiment) and provided with a bolt insertion hole 41.

The input busbar 30 and the output busbar 40 are arranged while being spaced apart from each other on the surface of the control circuit board 20 opposite to the one where the control circuit 22 is formed. The input busbar 30 and the output busbar 40 are so arranged that facing sides 32A, 42A facing each other are parallel. Partial areas of the input busbar 30 and the output busbar 40 are placed on the control circuit board 20 and areas where the bolt insertion holes 31, 41 are arranged are separated from the control circuit board 20.

The remaining one of the three busbars 30, 40 and 50 is a connection busbar 50. The connection busbar 50 is a T-shaped thick plate formed of an electrically conductive material (copper or copper alloy in this embodiment). The connection busbar 50 includes a connecting portion 51 and a reinforcing portion 52. The connecting portion 51 is a long and narrow rectangular plate forming a vertical plate part of the T shape. The connecting portion 51 is arranged between the input busbar 30 and the output busbar 40 with clearances defined between the connecting portion 51 and the input and output busbars 30, 40. Long sides of the connecting portion 51 are parallel to the facing sides 32A, 42A of the input busbar 30 and the output busbar 40. The reinforcing portion 52 is a long and narrow rectangular plate forming a horizontal plate part of the T shape, and arranged perpendicularly to the connecting portion 51 on one end of the connecting portion 51.

The reinforcing portion 52 is arranged with clearances defined between the reinforcing portion 52 and the input and output busbars 30, 40. Long sides of the reinforcing portion 52 are parallel to crossing sides 32B, 42B of the input busbar 30 and the output busbar 40 orthogonal to the facing sides 32A, 42A. That is, the reinforcing portion 52 extends along an arrangement direction of the input busbar 30, the connecting portion 51 and the output busbar 40. The reinforcing portion 52 functions to reinforce the control circuit board 20 so that the control circuit board 20 is not broken along the clearance between the input busbar 30 and the connecting portion 51 or along the clearance between the connecting portion 51 and the output busbar 40 when an unexpected large force is applied to the switching board 10.

As shown in FIG. 6, a plurality of first mounting windows 24A are arranged at positions straddling the input busbar 30 and the connecting portion 51, and parts of the input busbar 30 and parts of the connecting portion 51 are exposed inside the first mounting windows 24A. A plurality of second mounting windows 24B are arranged at positions straddling the output busbar 40 and the connecting portion 51, and parts of the output busbar 40 and parts of the connecting portion 51 are exposed inside the second mounting windows 24B.

Each of the semiconductor switching elements 60A, 60B is a power MOSFET and includes a housing 61 and a drain terminal 62, a source terminal 63 and a gate terminal 64 provided in this housing 61. The drain terminal 62 is arranged on the lower surface of the housing 61. Further, the source terminal 63 and the gate terminal 64 project from a side surface of the housing 61.

As shown in FIGS. 4 and 6, three semiconductor switching elements (first semiconductor switching elements 60A) of the six semiconductor switching elements 60A, 60B form one first element group 65A. The remaining three semiconductor switching elements (second semiconductor switching elements 60B) of the six semiconductor switching elements 60B, 60B form one second element group 65B.

Each of the first semiconductor switching elements 60A is arranged inside the first mounting window 24A. The drain terminal 62 and the source terminal 63 are respectively connected to the part of the input busbar 30 and the part of the connecting portion 51 exposed inside the first mounting window 24A. The gate terminal 64 is connected to the control circuit 22 on the control circuit board 20. Similarly, each of the second semiconductor switching elements 60B is arranged inside the second mounting window 24B. The drain terminal 62 and the source terminal 63 are respectively connected to the part of the output busbar 40 and the part of the connecting portion 51 exposed inside the second mounting window 24B, and the gate terminal 64 is connected to the control circuit 22. Connection can be carried out, for example, by solder H using a reflow solder technique.

By such an arrangement, three semiconductor switching elements 60A, 60B connected in parallel are formed into one set, whereby two sets of the semiconductor switching elements 60A, 60B are connected in series. The two sets of the semiconductor switching elements 60A, 60B are arranged back to back with each other.

A plurality of semiconductor switching elements 60A, 60B are formed into one set to be compatible with a large current. That is, by connecting the plurality of semiconductor switching elements 60A, 60B in parallel, a total amount of a current which can flow in a power supply circuit can be increased.

The two sets of the semiconductor switching elements 60A, 60B are arranged back to back for the following reason.

Generally, in a switch using a MOSFET, a parasitic diode by a p-n junction is generated between a source and a drain. Accordingly, even if a gate is turned off, a current flows from a source side to a drain side through this parasitic diode, wherefore a signal from the source side to the drain side cannot be shut off. Thus, when a voltage of the auxiliary battery 91 becomes higher than that of the main battery 90 (such as during an idling stop), the current may flow into the main battery 90 from the auxiliary battery 91 through the parasitic diode although the switch is off. By connecting two sets of MOSFETs in series to reverse an orientation of the parasitic diode, currents in both directions can be shut off.

A fastening terminal 71A connected to a harness 70A leading to the main battery 90 is fixed to the input busbar 30 by a power supply terminal 72A (stud bolt) inserted through the bolt insertion hole 31 and a nut 73A fastened to the tip of this power supply terminal 72A. Further, a fastening terminal 71B connected to a harness 70B leading to the auxiliary battery 91 is fixed to the output busbar 40 by a power supply terminal 72B (stud bolt) inserted through the bolt insertion hole 41 and a nut 73B fastened to the tip of this power supply terminal 72B.

The casing 80 includes an upper case 81 and a lower case 82. The lower case 82 is a tray-like case having an outer shape one size larger than that of the switching board 10. The switching board 10 is accommodated into the lower case 82. The upper case 81 is a tray-like case having substantially the same outer shape as the lower case 82, and mounted on the lower case 82 to cover the switching board 10 accommodated in the lower case 82. Both the upper and lower cases 81, 82 are made of synthetic resin.

According to this embodiment, the busbars 30, 40 and 50, the control circuit board 20 and the semiconductor switching elements 60A, 60B necessary for the switching board 10 can be simply laid out between the main battery 90 and the auxiliary battery 91, and the simply configured switching board 10 can be provided. Further, since the connection busbar 50 includes the connecting portion 51 and the reinforcing portion 52, the connection busbar 50 can be provided with a reinforcing function by a simple configuration. By this reinforcing effect, the deflection of the control circuit board 20 can be suppressed, for example, in a reflow solder mounting process.

Figure 11:
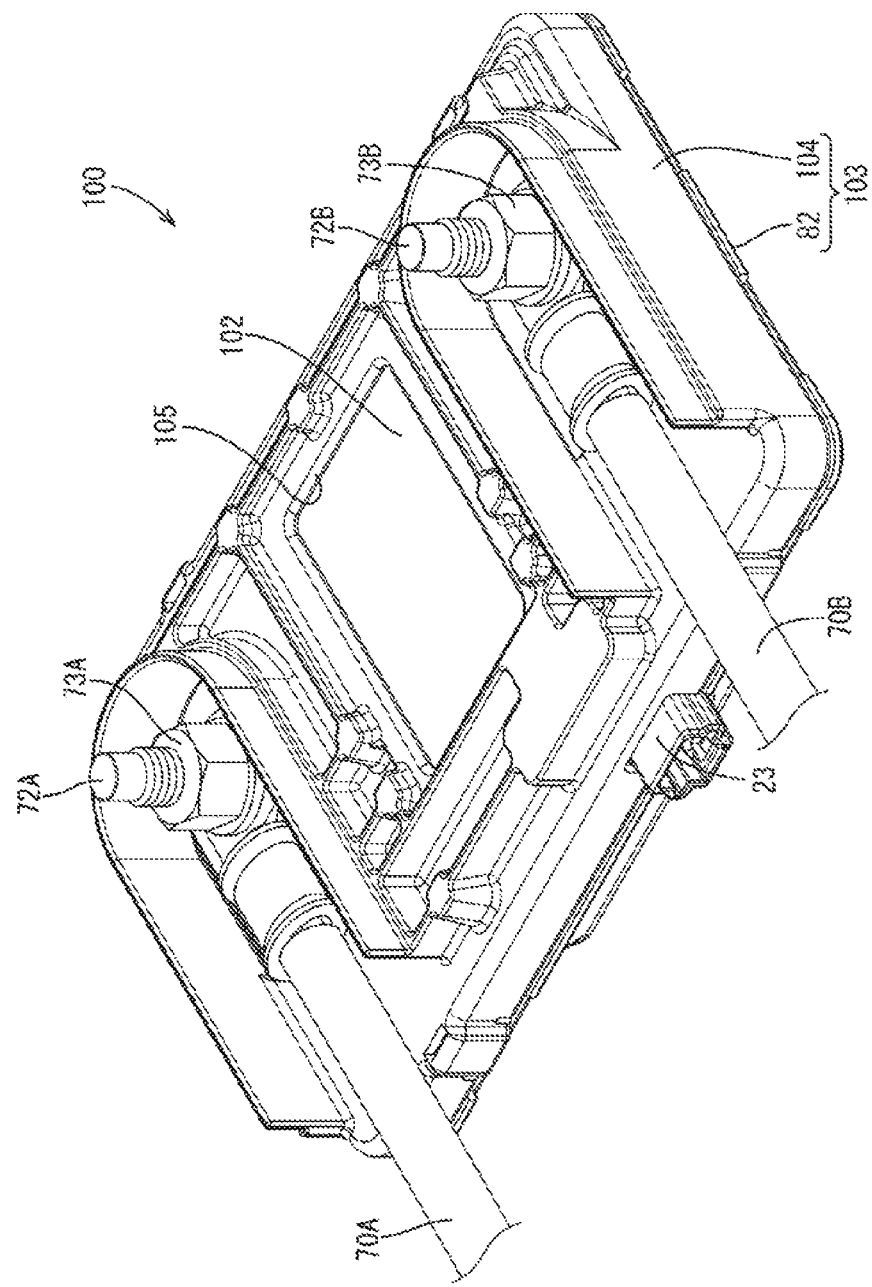
FIG. 11 is a perspective view of a switching device of a modification.
Figure 12:
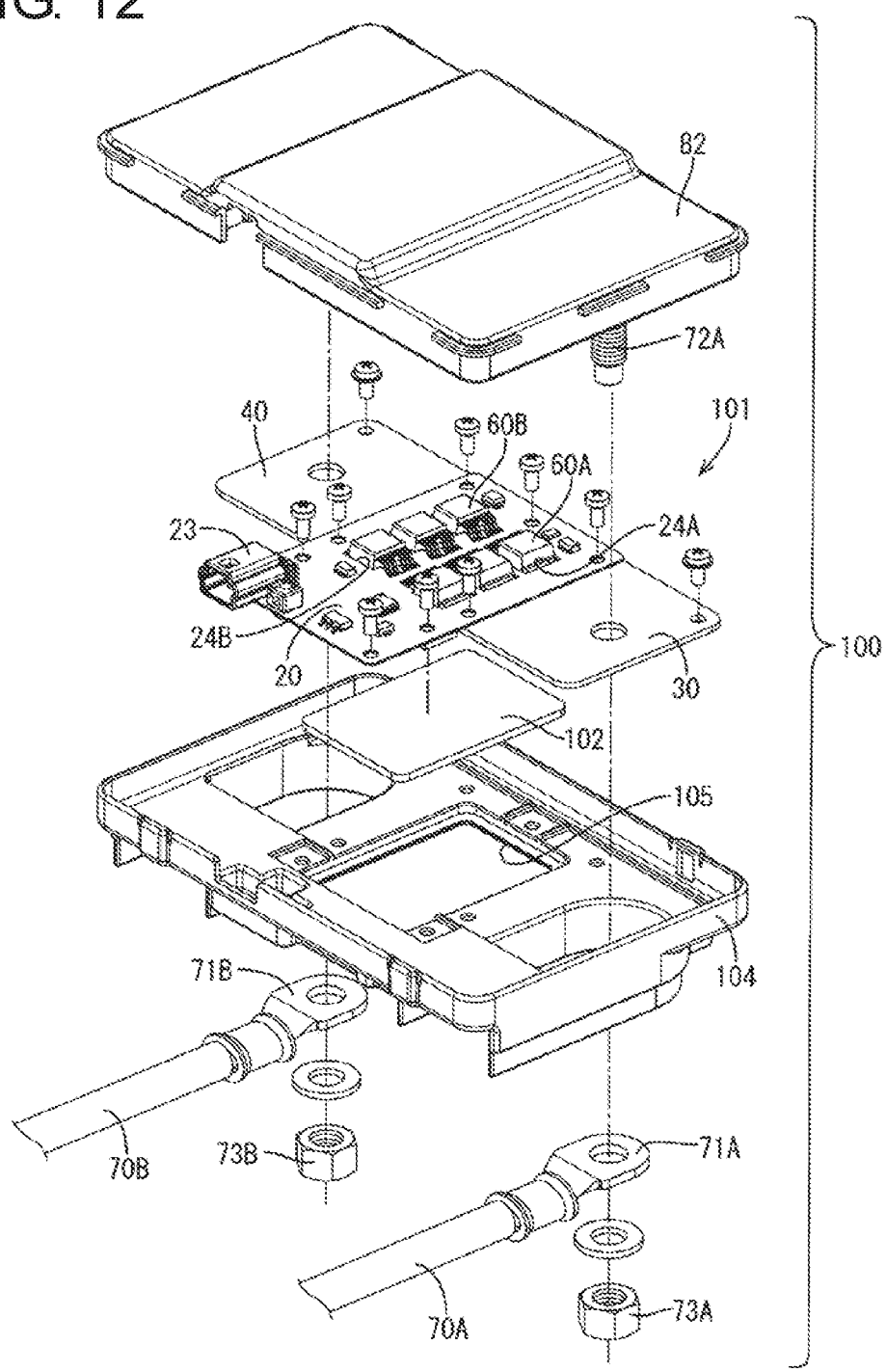
FIG. 12 is an exploded perspective view of the switching device of the modification.
Figure 13:
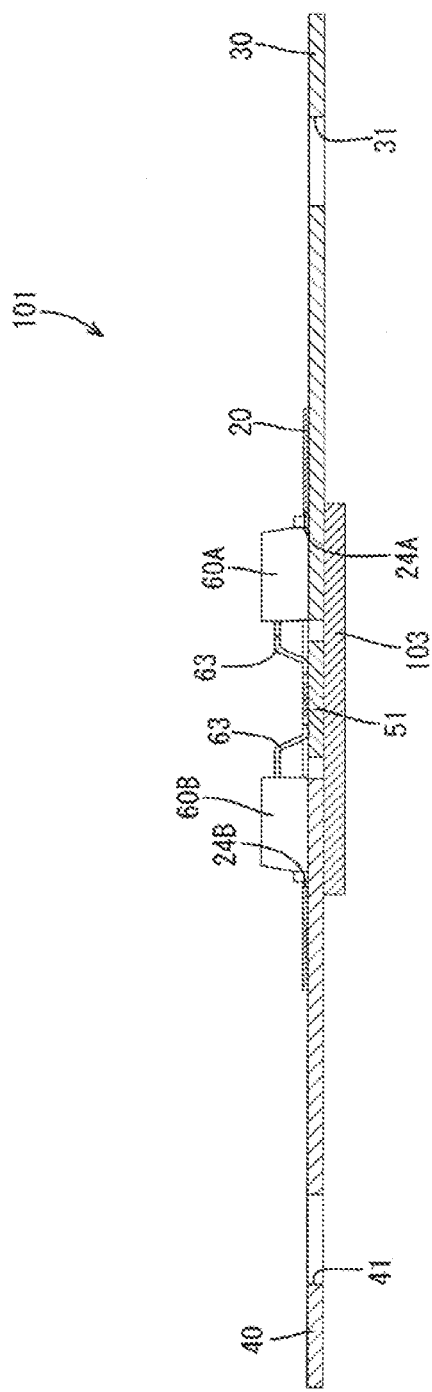
FIG. 13 is a section of a switching board of the modification cut at the same position as line A-A of FIG. 6.

A modification of the present invention is described with reference to FIGS. 11 to 13. A switching device 100 of this modification is configured similarly to the embodiment except that a switching board 101 includes a heat radiation plate 102 and an upper case 104 of a casing 103 includes a heat radiation window 105 for exposing the heat radiation plate 102 to outside. In the switching device 100, components similar to those of the embodiment are denoted by the same reference signs and not described.

The heat radiation plate 102 is a rectangular plate made of metal and placed on surfaces of busbars 30, 40 and 50 opposite to those where a control circuit board 20 is arranged. An outer shape of the heat radiation plate 102 has such a size as to cover an area on the switching board 10 where all of a plurality of semiconductor switching elements 60A, 60B are arranged.

The heat radiation window 105 is a rectangular opening penetrating from a surface of the upper case 104 facing the heat radiation plate 102 to an opposite surface and the heat radiation plate 102 is facing outside through this heat radiation window 105.

According to the configuration as described above, heat can be efficiently radiated without enlarging the switching board 101.

The present invention is not limited to the above described and illustrated embodiment. For example, the following embodiments are also included in the technical scope of the present invention.

(1) Although the connection busbar 50 is a T-shaped plate including the connecting portion 51 and the reinforcing portion 52 in the above embodiment, the connection busbar may not necessarily be T-shaped and may be, for example, an I-shaped plate including no reinforcing portion. Further, the connecting portion may not necessarily be arranged between the input busbar and the output busbar.

(2) Although the auxiliary power supply is the auxiliary battery 91 in the above embodiment, a storage device such as a secondary battery or an electric double layer capacitor can be used as the auxiliary power supply.

(3) Although three mounting windows 24A, 24B form one set and three semiconductor switching elements 60A, 60B form one set in the above embodiment, the number of the semiconductor switching elements forming one set may be two, four or more. Similarly, the number of the mounting windows forming one set may be two, four or more.

The invention claimed is:

1. A switching board to be arranged between a main power supply and an auxiliary power supply in a vehicle provided with the main power supply and the auxiliary power supply, comprising:
   a circuit constituent with an insulating plate made of an insulating material, a control circuit arranged on one surface of the insulating plate, a circuit control board including a plurality of mounting windows penetrating from the surface of the insulating plate where the control circuit is provided to an opposite surface, an input busbar and an output busbar arranged on the opposite surface of the insulating plate while being spaced apart from each other, and a connection busbar arranged with clearances defined between the connection busbar and the input busbar and the output busbar; and
   a plurality of semiconductor switching elements mounted on the circuit constituent and each including a drain terminal, a source terminal and a gate terminal;
   wherein:
   some mounting windows of the plurality of mounting windows are first mounting windows where parts of the input busbar and parts of the connection busbar are exposed inside and the other mounting windows are second mounting windows where parts of the output busbar and parts of the connection busbar are exposed inside;
   some semiconductor switching elements of the plurality of semiconductor switching elements are first semiconductor switching elements arranged inside the first mounting windows and having the drain terminals connected to the parts of the input busbar, the source terminals connected to the parts of the connection busbar and the gate terminals connected to the control circuit, and the other semiconductor switching elements are second semiconductor switching elements arranged inside the second mounting windows and having the drain terminals connected to the parts of the output busbar, the source terminals connected to the parts of the connection busbar and the gate terminals connected to the control circuit; and
   the first semiconductor switching elements are arranged in parallel to one another and connected to the connection busbar; the second semiconductor switching elements are arranged in parallel to one another and connected to the connection busbar by a respective source terminal so as to place the first semiconductor switching elements in series with the second semiconductor switching elements.

2. A switching board according to claim 1, wherein the connection busbar includes a connecting portion arranged between the input busbar and the output busbar and a reinforcing portion extending along an arrangement direction of the input busbar and the output busbar.

3. A switching board according to claim 1, wherein the circuit constituent includes a heat radiation plate arranged on surfaces of the input busbar, the output busbar and the connection busbar opposite to the control circuit board.

4. A switching board according to claim 2, wherein the circuit constituent includes a heat radiation plate arranged on surfaces of the input busbar, the output busbar and the connection busbar opposite to the control circuit board.

5. A switching board according to claim 1, wherein the first row of the first mounting windows and the first semiconductor switching elements are arranged in a back to back configuration with the second of the second mounting windows and the second semiconductor switching elements.

* * * * *